United States Patent
Harper

(10) Patent No.: US 10,957,362 B1
(45) Date of Patent: Mar. 23, 2021

(54) NON-INTERFERING MICRO-POSITIONING SYSTEM UTILIZING PIEZOELECTRIC ELEMENTS

(71) Applicant: International Business Machines Corporation, Armonk, NY (US)

(72) Inventor: David Harper, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/567,905

(22) Filed: Sep. 11, 2019

(51) Int. Cl.
| | | |
|---|---|---|
| *G11B 5/58* | (2006.01) | |
| *G11B 33/12* | (2006.01) | |
| *G11B 21/02* | (2006.01) | |
| *H01L 41/09* | (2006.01) | |
| *G11B 5/55* | (2006.01) | |
| *G11B 5/584* | (2006.01) | |
| *G11B 5/48* | (2006.01) | |
| *G11B 5/592* | (2006.01) | |

(52) U.S. Cl.
CPC .......... *G11B 33/124* (2013.01); *G11B 5/4893* (2013.01); *G11B 5/55* (2013.01); *G11B 5/58* (2013.01); *G11B 5/584* (2013.01); *G11B 21/02* (2013.01); *H01L 41/09* (2013.01); *G11B 5/5504* (2013.01); *G11B 5/592* (2013.01)

(58) Field of Classification Search
None
See application file for complete search history.

(56) References Cited

U.S. PATENT DOCUMENTS

| | | |
|---|---|---|
| 4,258,398 A | 3/1981 | Bixby et al. |
| 4,520,411 A | 5/1985 | Ohshima |
| 4,573,619 A | 3/1986 | Grant |
| 5,191,492 A | 3/1993 | Nayak et al. |
| 5,206,771 A | 4/1993 | Katou |
| 5,280,402 A | 1/1994 | Anderson |
| 5,371,636 A | 12/1994 | Nayak |
| 5,377,052 A | 12/1994 | Guzman |
| 5,379,170 A | 1/1995 | Schwarz |
| 5,395,067 A | 3/1995 | Kano |
| 5,438,469 A | 8/1995 | Rudi |
| 5,450,257 A | 9/1995 | Tran et al. |

(Continued)

FOREIGN PATENT DOCUMENTS

| | | |
|---|---|---|
| GB | 2076579 A | 12/1981 |
| GB | 2265045 A | 9/1993 |
| JP | 05151661 A | 6/1993 |

OTHER PUBLICATIONS

Boettcher, et al., "Dynamic Modeling and Control of a Piezo-Electric Dual-Stage Tape Servo Actuator," IEEE Transactions on Magnetics, vol. 45, No. 7, Jul. 2009, pp. 3017-3024.

(Continued)

*Primary Examiner* — Jefferson A Evans
(74) *Attorney, Agent, or Firm* — Jared L. Montanaro

(57) ABSTRACT

Implementation of a non-interfering micro-positioning device, for a tape drive write/read head module assembly utilizing piezoelectric elements, by generating at least two flexure brackets. The at least two flexure brackets may include the piezoelectric elements. Affixing at least one flexure bracket to a first side of the write/read head module assembly. Affixing at least one other flexure bracket to a second side of the write/read head module assembly.

16 Claims, 10 Drawing Sheets

(56) References Cited

U.S. PATENT DOCUMENTS

| | | | |
|---|---|---|---|
| 5,508,865 | A | 4/1996 | La Garcia |
| 5,546,259 | A | 8/1996 | Iwata |
| 5,661,616 | A | 8/1997 | Tran |
| 5,710,681 | A | 1/1998 | Eckberg |
| 5,726,834 | A | 3/1998 | Eckberg |
| 5,793,573 | A | 8/1998 | Eckberg |
| 5,883,760 | A | 3/1999 | Yamada et al. |
| 5,923,494 | A | 7/1999 | Arisaka et al. |
| 5,978,172 | A | 11/1999 | Nayak et al. |
| 6,075,678 | A | 6/2000 | Saliba |
| 6,282,057 | B1 | 8/2001 | Konishi |
| 6,442,004 | B1 | 8/2002 | Heinz |
| 6,736,351 | B2 | 5/2004 | Lee |
| 6,914,754 | B2 | 7/2005 | Tamura |
| 7,123,432 | B2 | 10/2006 | Komai |
| 7,227,724 | B2 | 6/2007 | Nayak |
| 7,289,300 | B2 | 10/2007 | McCarthy |
| 7,301,724 | B2 | 11/2007 | Brittenham |
| 7,359,160 | B2 | 4/2008 | Koga et al. |
| 7,474,495 | B2 | 1/2009 | Weng et al. |
| 7,505,221 | B2 | 3/2009 | Watson |
| 7,538,982 | B2 | 5/2009 | Ycas |
| 7,589,938 | B2 | 9/2009 | Gatzen |
| 8,059,355 | B2 | 11/2011 | Nayak |
| 8,270,114 | B2 | 9/2012 | Argumedo et al. |
| 8,619,392 | B2 | 12/2013 | Argumedo |
| 8,724,247 | B2 * | 5/2014 | Poorman ............... G11B 5/584 360/75 |
| 8,861,121 | B2 | 10/2014 | Underkofler |
| 2002/0176203 | A1 | 11/2002 | Saito |
| 2005/0063099 | A1 | 3/2005 | West |
| 2005/0201017 | A1 | 9/2005 | Koga |
| 2006/0050428 | A1 | 3/2006 | Brittenham |
| 2006/0103968 | A1 | 3/2006 | Jurneke |
| 2006/0256465 | A1 | 11/2006 | Biskeborn |
| 2007/0131811 | A1 | 6/2007 | Biskeborn |
| 2008/0068753 | A1 | 3/2008 | Biskeborn |
| 2008/0198506 | A1 * | 8/2008 | Weng ................ G11B 5/5504 360/101 |
| 2009/0201608 | A1 | 8/2009 | Argumedo |
| 2011/0255195 | A1 | 10/2011 | Poorman et al. |
| 2014/0029131 | A1 | 1/2014 | Engelen |
| 2015/0318462 | A1 * | 11/2015 | Kim ..................... G06F 3/016 310/332 |
| 2015/0320300 | A1 * | 11/2015 | Gershov ............. A61B 1/0615 600/109 |
| 2015/0348586 | A1 | 12/2015 | Yeakley et al. |
| 2019/0121123 | A1 * | 4/2019 | Kaupmann ........... G02B 26/10 |
| 2020/0073113 | A1 * | 3/2020 | Nystrom ............ G02B 26/0858 |

OTHER PUBLICATIONS

Cherubini et al., "Control Methods in Data-Storage Systems", IEEE Transactions on Control Systems Technology, vol. 20, o. 2, Mar. 2012, pp. 296-322.

Raeymaekers et al., "Design of a dual stage actuator tape head with high-bandwidth track following capability", ASME Information Storage and Processing Systems Conference, 2007, 4 pgs.

Harper et al., "Dynamic Tape Guide Bearing Tilt Mechanism," U.S. Appl. No. 16/567,849, filed Sep. 11, 2019.

Harper, D., "Semi-Flexible Structure for Micro-Positioning a Write/Read Head," U.S. Appl. No. 16/567,942, filed Sep. 11, 2019.

List of IBM Patents or Patent Applications Treated as Related, Sep. 11, 2019, 2 pgs.

* cited by examiner

NON-INTERFERING MICRO-POSITIONING SYSTEM UTILIZING PIEZOELECTRIC ELEMENTS

BACKGROUND

The present disclosure relates generally to the field of tape media data storage, and more specifically to increasing the precise motion of a tape write/read head during tape operations.

The general goal in the tape storage industry is to be able to store higher amounts of data with each subsequent generation of tape cartridge and drive. In order to do this, the number of data tracks for a given width of tape keeps increasing. As the number of tracks increases, the size of the tracks is reduced and the requirements for increased precision of the dynamic placement of the write/read head during tape operations correspondingly increases.

Further, traditional piezoelectric materials are materials that produce an electric charge when mechanical stresses are applied. However, some piezoelectric materials are able to have a reverse effect where, when an electric charge (e.g., voltage, current) is applied, they mechanically expand or contract.

SUMMARY

Embodiments of the present disclosure include a method for implementing a non-interfering micro-positioning device for a tape drive write/read head module assembly utilizing piezoelectric elements. At least two flexure brackets may be generated. The at least two flexure brackets may include piezoelectric elements. At least one flexure bracket may be affixed to a first side of the write/read head module assembly. At least one other flexure bracket may be affixed to a second side of the write/read head module assembly.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
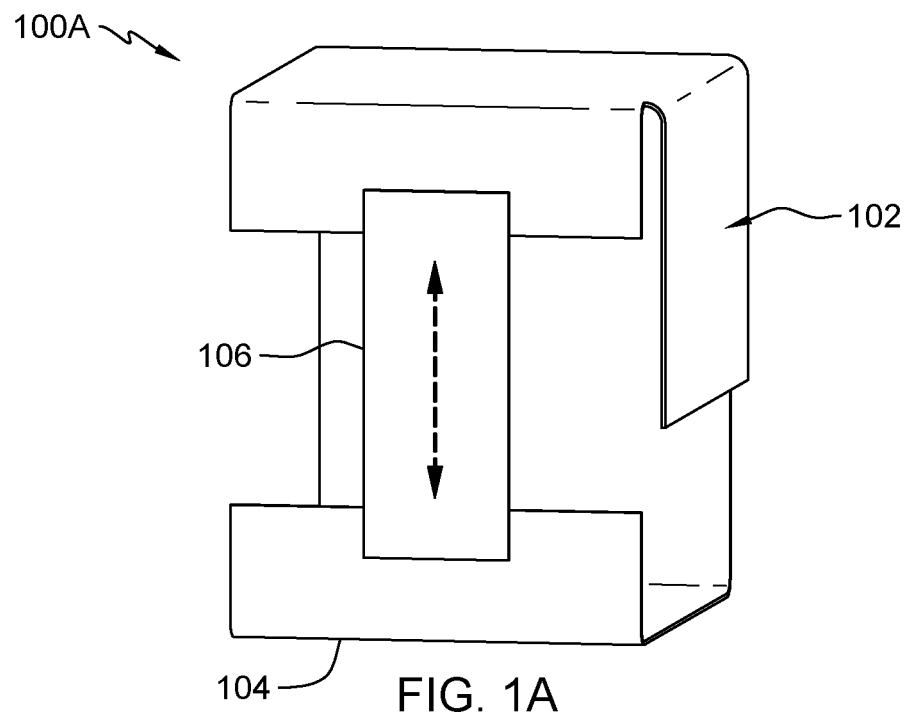
FIG. 1A depicts a top-down, front view of a flexure bracket with a bonding surface directed outward, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relates generally to the field of tape media data storage, and more specifically to increasing the precise motion of a tape during tape operations. It should be noted that a "tape" is defined as a flexible magnetic tape medium. While the present disclosure is not necessarily limited to such applications, various aspects of the disclosure may be appreciated through a discussion of various examples using this context.

Tape drives generally consist of a flexible magnetic tape medium that is transported, via reel motors, from one hub to another, and which has a set width. The magnetic tape medium is typically stored in a tape cartridge that can be removed and stored separately from a tape drive. Data is stored on the tape media in a controlled manner that allows for the retrieval of data at a later time. Data is generally stored on data tracks at predefined widths on the width of the flexible magnetic tape medium.

The general goal in the tape storage industry is to store greater amounts of data with each subsequent generation of tape cartridge and tape drive without increasing the width of the flexible magnetic tape medium. Accordingly, there is an ongoing need to increase the number of data tracks for the given width of the flexible magnetic tape medium (e.g., decrease the width/spacing between the data tracks). Further, there is an ongoing need to have increased control of the motion of the tape as generations progress. Accordingly, as the number of data tracks increases, the size of the data tracks is reduced and the requirements for increased precision of the dynamic placement of the write/read head module assembly during tape operations is needed as generations progress. Typically, the requirement to improve the track following operation requires a reduction in the position error signal (PES). PES reduction can be achieved by improving the performance of the write/read head actuator mechanism.

One method for improving the dynamic track following capability is to use a micro-actuator in addition to the traditional write/read head following actuator that is typically implemented in tape drive systems. Implementation of a micro-actuator allows for enhanced micro-positioning of the write/read head as a secondary stage used during track following. The method described hereinbelow in more detail demonstrates such a system that can be used in tandem with the traditional track following system, and which does so in a compact manner. It is noted that due to the unique nature of the described design, the micro-actuator motion is amplified to allow for increased motion of the write/read head.

Accordingly, the described method/system is suitable for ultra-fine movements, such as those found in piezoelectric stacks, which could then be converted into larger movements. For example, due to the nature of the proposed semi-flexible bracket, the motion of a piezoelectric stack with one micrometer of stack expansion, would be converted into two micrometers of track follow motion at the write/read head. This increase in gain allows for a wider range of motion to be covered, but still use ultra-fine actuator motion.

Another method for improving the dynamic track following capability is to use a micro-actuator consisting of a series of piezoelectric elements in addition to the traditional write/read head module assembly following actuator typically implemented in tape drive systems. Implementation of piezoelectric elements can allow for enhanced micro-positioning of the write/read head module assembly as a secondary stage used during track following. The method described hereinbelow with more detail demonstrates such a system that can be used in tandem with the traditional track following system, but does so without interfering with the write/read head cables that need to be placed on the actuator assembly without interference. This is in contrast to the traditional approach where the head cables, that connect the head to a main logic card in order to transfer data, must be attached to the write/read head module assembly prior to being inserted into the actuator assembly, which can therefore be subject to mechanical interference.

By implementing piezoelectric elements on a series of flexures (e.g., brackets, elements engineered to be compliant within a specific degree of physical adjustment, etc.), which could be made by etching, stamping, and/or bending, a micro-actuator system can be implemented without cable interference. The write/read head module assembly would then be bonded to the movable surfaces of the flexures that can be moved by activation of the piezoelectric elements. The flexures may be mounted in (e.g., on, to, etc.) the outer corners/edges/sides/etc. of the write/read head module assembly so that they may move with the traditional fine track following actuator, typically driven by a voice coil motor (VCM).

Further, it is also typical, that tape motion is controlled by using roller guide bearings that need to be precisely aligned with respect to a tape drive and its datums. Misalignment in the tilt of the rollers can cause increased error in the track following functions while the write/read tape head is being positioned to accurately follow the tape tracks. As part of the track following procedures, it is also desirable to minimize tape tilt, also known as 'tape skew.'

Tape skew can occur periodically or randomly as a tape moves from one reel to another reel. A small amount of offset can be enough to cause the tape to steer into other moving components and cause higher error during track following (e.g. position error signal increases). In ordinary embodiments, tape skew may be minimized by implementing an actuator at a write/read head to compensate for the tape skew. However, proposed in this disclosure is another method to control tape skew so that the head actuator does not need to be rotated to match the tilt of the tape during operation(s). A piezoelectric stack is implemented that can precisely, and dynamically, tilt a roller guide bearing to reduce and/or eliminate the effects of tape skew.

By strategically locating a piezoelectric stack under a tape path guide roller bearing structure, and by causing the piezoelectric stack to expand or contract, the tilt of a roller can be modified, thus reducing, or eliminating, the amount of tape skew encountered during operation. The advantage of using such a technique is that it will reduce complexity of the write/read actuator that exists in some production tape products in the applicable market.

Using a piezoelectric stack to modify the amount of tilt of the roller bearing will help to reduce the overall track following error with a simplified head actuator system. By modifying the supporting bracket that holds the roller bearing, the gain, or amplification, of the amount of tilt for a given amount of piezoelectric stack expansion or contraction can be adjusted as desired, which, will again reduce, or eliminate, the effects of tape skew.

Example embodiments will now be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper," "lower," "right," "left," "vertical," "horizontal," "top," "bottom," and derivatives thereof shall relate to the disclosed structures and methods, as oriented in the drawing figures. Terms such as "above," "overlying," "atop," "on top," "positioned on," or "positioned atop" mean that a first element, such as a first structure, is present on a second element, such as a second structure, wherein intervening elements, such as an interface structure, may be present between the first element and the second element. The term "direct contact" means that a first element, such as a first structure, and a second element, such as a second structure, are connected without any intermediary conducting, insulating, or semiconductor layers at the interface of the two elements. The term substantially, or substantially similar, refers to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present disclosure, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present disclosure. Additionally noted is that like reference numerals are used to designate like parts in the accompanying drawings.

Turning now to FIG. 1A, depicted is a top-down, front view of a flexure bracket 100A with a bonding surface 102 directed outward, in accordance with embodiments of the present disclosure. In some embodiments, the flexure bracket 100A is generated via the processes described above (e.g., etching, stamping, bending, etc.). The flexure bracket 100A may be comprised of any malleable material (e.g., metal, polymer, etc.) that would not interfere with a VCM or other head assembly components. In some embodiments, the flexure bracket 100A includes a piezoelectric element 106.

The flexure bracket 100A includes a mechanical ground 104, which, for the purposes of this disclosure is the bottom portion of the flexure bracket 100A. The mechanical ground 104 prevents the piezoelectric element 106 from expanding or contracting in dual directions. That is, the mechanical ground 104 allows the piezoelectric element 106 to direct all of the movement in one direction, either away from the mechanical ground 104 (e.g., due to the piezoelectric element 106 expanding), or toward the mechanical ground 104 (e.g., due to the piezoelectric element 106 contracting). It is contemplated that the flexure bracket 100A will be affixed to a first side of a write/read head module assembly (to be discussed more fully in regard to FIGS. 2 and 3) via the bonding surface 102.

Figure 1B:
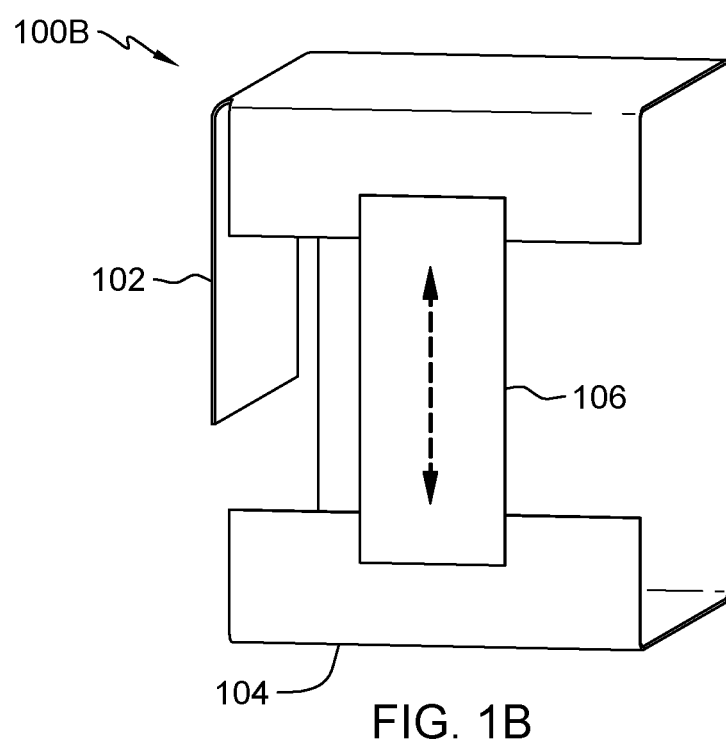
FIG. 1B depicts a top-down, front view of a flexure bracket with a bonding surface directed inward, in accordance with embodiments of the present disclosure.

Referring now to FIG. 1B, depicted is a top-down, front view of a flexure bracket 100B with a bonding surface 102 directed inward, in accordance with embodiments of the present disclosure. The flexure bracket 100B may be the same, or substantially similar to, the flexure bracket 100A of FIG. 1A and/or may comprise the same components (e.g., bonding surface 102, mechanical ground 104, and piezoelectric element 106) as the flexure bracket 100A of the FIG. 1A.

It is contemplated that the flexure bracket 100B will be affixed to a second side of a write/read head module assembly via the bonding surface 102. In some embodiments, the flexure bracket 100B is affixed on the write/read head module assembly opposite the flexure bracket 100A (e.g., the second side of the write/read head module assembly is an opposite face of the write/read head module assembly).

In some embodiments, the flexure bracket 100B is affixed to the write/read head module assembly above or below the flexure bracket 100A (e.g., the second side of the write/read head module assembly is the opposite direction of the same face of the write/read head module assembly).

Figure 2:
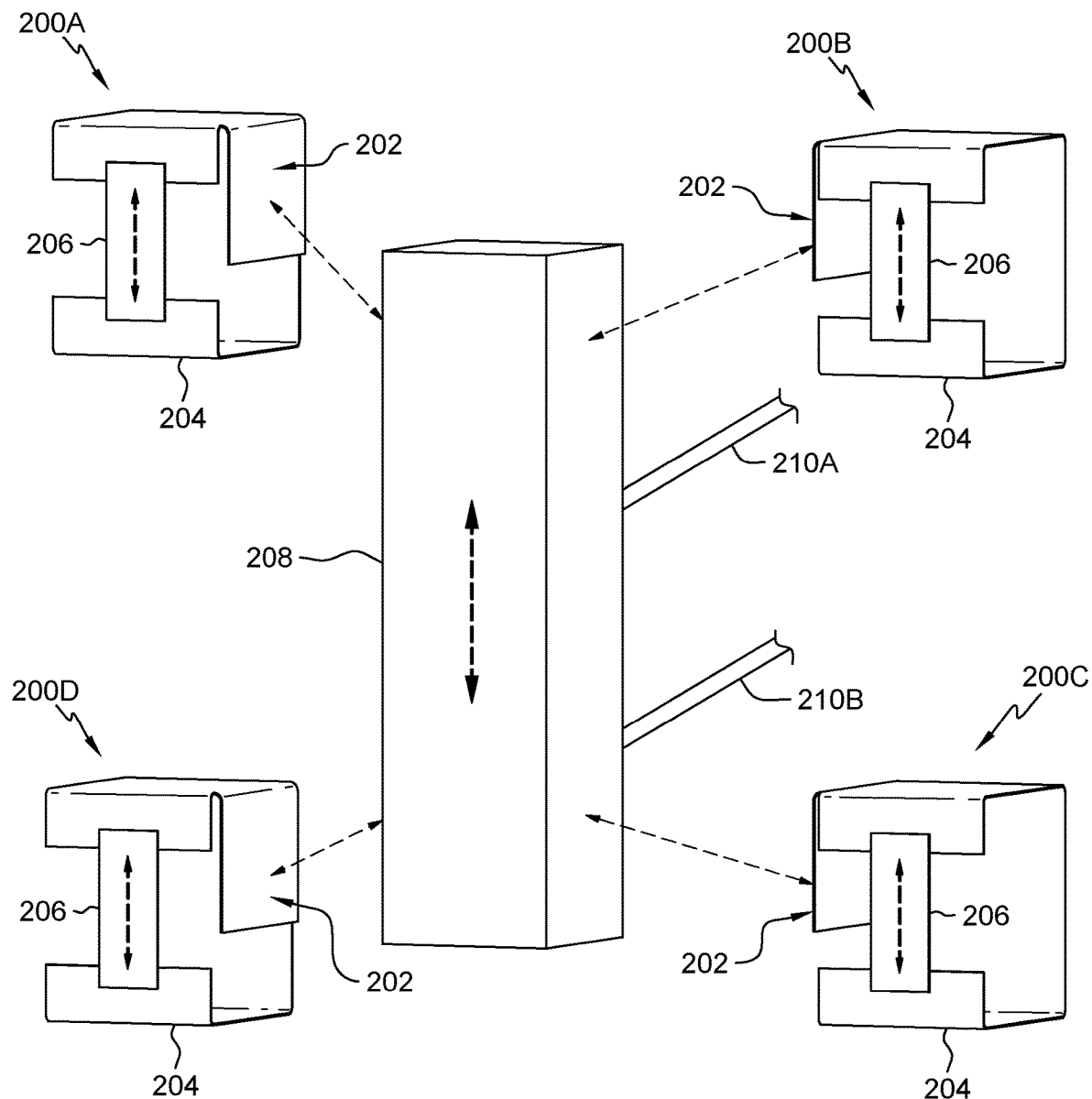
FIG. 2 depicts a top-down, front view of a write/read head module assembly being affixed with multiple flexure brackets, in accordance with embodiments of the present disclosure.

Referring now to FIG. 2, depicted is a top-down, front view of a write/read head module assembly 208 being affixed with multiple (e.g., at least two) flexure brackets 200A-D, in accordance with embodiments of the present disclosure. The flexure brackets 200A-D may be the same as, or substantially similar to, the flexure brackets 100A and 100B of FIGS. 1A and 1B, respectively. In some embodiments, each of the flexure brackets 200A-D includes a bonding surface 202, a mechanical ground 204, and piezoelectric element 206.

For continuing purposes of this description of FIG. 2, it is noted that head cables 210A and 210B are partially shown to indicate in which direction the write/read head module 208 will travel when operational. Further, a traditional VCM is not shown, but all four of the flexure brackets 200A-D are to be affixed (e.g., bonded, mounted, etc.) to the traditional VCM at the outer corner regions of the write/read head module assembly 208.

It is further noted that the moveable beam of the VCM assembly would normally have been bonded directly to the write/read head module assembly 208, but instead the VCM moveable beam is bonded to the four flexure brackets 200A-D utilizing another bonding surface of the flexure brackets 200A-D that is not shown. The write/read head module assembly 208 is then bonded and supported by the four flexure brackets 200A-D.

In some embodiments, as noted by the use of the flexure brackets 200A-D, there is a flexure (e.g., 200A-D) for each of a top portion and a bottom potion of the first side of the write/read head module assembly and the second side of the write/read head module assembly. For instance the flexure bracket 200A will be affixed, as denoted by the dashed arrow, to a top portion of the first side of the write/read head module assembly 208 and the flexure bracket 200D will be affixed, as denoted by the dashed arrow, to a bottom portion of the first side of the write/read head module assembly 208.

Further, flexure bracket 200B will be affixed, as denoted by the dashed arrow, to a top portion of the second side of the write/read head module assembly 208 and flexure bracket 200C will be affixed, as denoted by the dashed arrow, to a bottom portion of the second side of the write/read head module assembly 208.

In some embodiments, the head cables 210A and 210B and the mechanical grounds 204 are used for the write/read head module assembly 208 to shift on (as depicted by the directional arrows found in the piezoelectric elements 206 of the flexure brackets 200A-D and the write/read head module assembly 208) in a particular direction.

In some embodiments, shifting the write/read head module assembly 208 in the particular direction includes energizing the piezoelectric elements 206 of the flexure brackets 200A-D in order to shift the write/read head module assembly 208 in the particular direction (e.g., up, down, left, right, etc. as denoted by the direction arrow illustrated in the write/read head module assembly 208).

In some embodiments, energizing the piezoelectric elements 206 of the flexure brackets 200A-D in order to shift the write/read head module assembly 208 in the particular direction includes energizing the piezoelectric elements 206 of the flexure brackets 200A-D in concert (e.g., unison). For instance, energizing the piezoelectric elements 206 of the flexure brackets 200A-D with a negative polarity will cause their piezoelectric elements 206 to contract and move the write/read head module assembly 208 downward, while energizing the piezoelectric elements 206 of the flexure brackets 200A-D with a positive polarity will cause their piezoelectric elements 206 to expand and move the write/read head module assembly 208 upward, or vice-a-versa (e.g., negative polarity causes expansion and positive polarity causes contraction).

In some embodiments, shifting the write/read head module assembly 208 in the particular direction is done in a corresponding direction as a placement of the mechanical grounds 204 of the flexure brackets 200A-D. That is, since the mechanical grounds 204 prevent the movement of the piezoelectric elements 206 in a particular direction depending on whether the piezoelectric elements 206 are expanding or contracting, the write/read head module assembly 208 is forced to move in a direction dependent on the mechanical grounds 204.

For example, if each of the piezoelectric elements 206 contracts, they will pull toward the mechanical grounds 204 and thus pull the write/read head module assembly 208 downward. Whereas, if each of the piezoelectric elements 206 expands, they will push away from the mechanical grounds 204 and thus push the write/read head module assembly 208 upward.

In some embodiments, the positioning of the bonding surfaces 202 of the flexure brackets 200C and 200D may be inverted from those of the flexure brackets 200A and 200B. That is, the mechanical grounds 204 of flexure brackets 200C and 200D may be pointed upward instead of as downward as depicted. This would result in the piezoelectric elements 206 of the flexure brackets 200C and 200D needing to be energized with an opposing polarity to that of the piezoelectric elements 206 of the flexure brackets 200A and 200B to have the flexure brackets 200A-D work in concert and shift the write/read head module assembly 208.

For example, if the piezoelectric elements 206 of the flexure brackets 200A and 200B are energized with a negative polarity, the piezoelectric elements 206 of the flexure brackets 200C and 200D would need be energized with a positive polarity in order to shift the write/read head module assembly 208 downward. That is because the piezoelectric elements 206 of the flexure brackets 200A and 200B would contract, pulling downward toward their respective mechanical grounds 204 of the flexure brackets 200A and 200B, while, in concert, the piezoelectric elements 206 of the flexure brackets 200C and 200D would expend, pushing downward from the their respective mechanical grounds 204 of the flexure brackets 200C and 200D. Thus generating a net shift downward, or vice-a-versa.

It is noted that the micro-movements of the piezoelectric elements 206 are within the range of microns and allow for the precise movement, positioning, and/or repositioning of the write/read head module assembly 208, which allows for a magnetic tape media to be more densely compacted with data tracks, as the write/read head module assembly 208 can now position itself to write/read the compacted data tracks.

Figure 3:
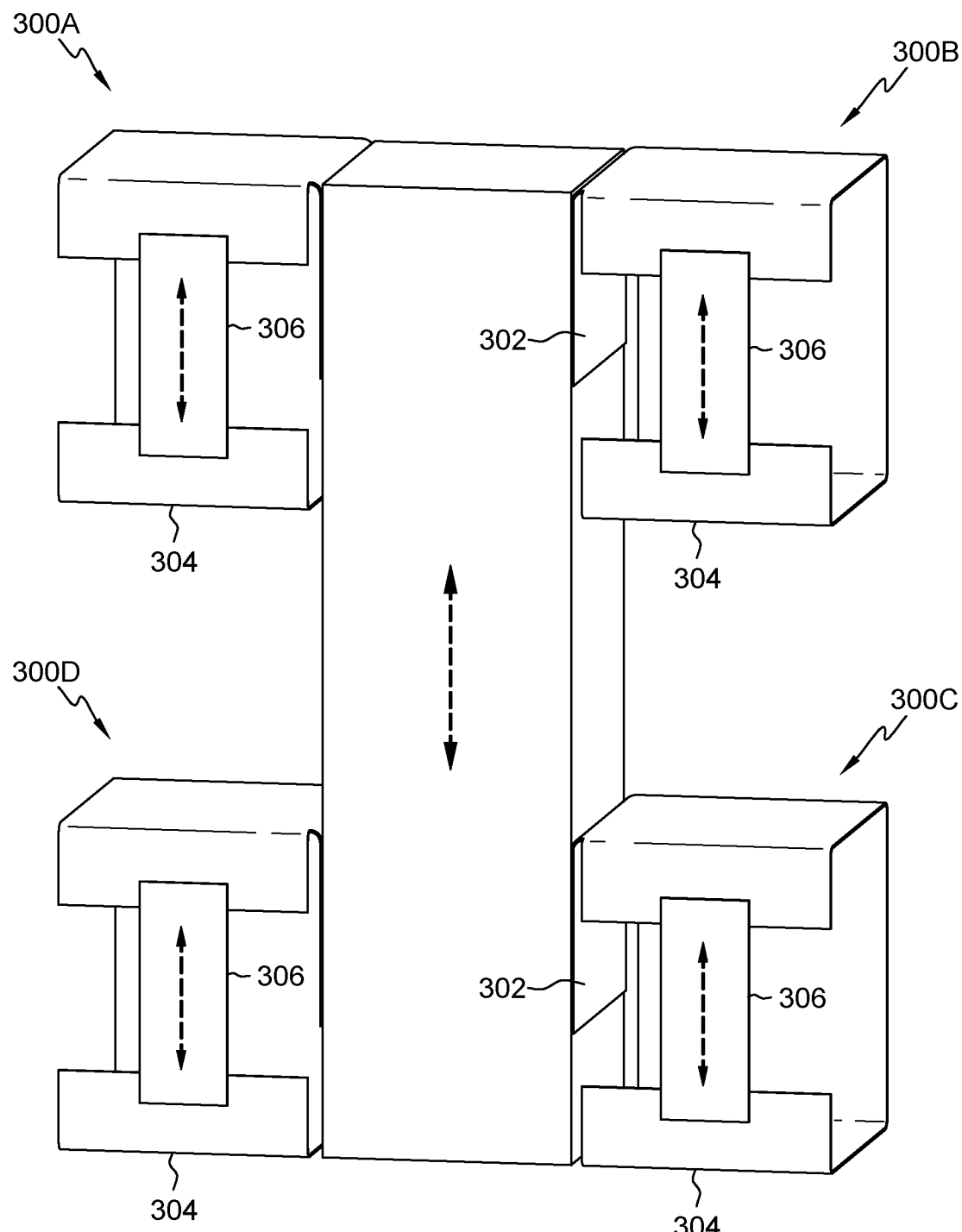
FIG. 3 depicts a top-down, front view of a write/read head module assembly affixed with multiple bonded flexure brackets, in accordance with embodiments of the present disclosure.

Referring now to FIG. 3, depicted is a top-down, front view of a write/read head module assembly 308 affixed with multiple bonded flexure brackets 300A-D, in accordance with embodiments of the present disclosure. The flexure brackets 300A-D may be the same as, or substantially similar to, the flexure brackets 100A, 100B, or 200A-D of FIGS. 1A, 1B, and 2, respectively. In some embodiments, each of the flexure brackets 300A-D includes a bonding surface 302, a mechanical ground 304, and piezoelectric element 306. Further, the write/read head module assembly 308 may be the same, or substantially similar, write/read head module assembly as the write/read head module assembly 208 of FIG. 2.

FIG. 3, denotes the bonding of the write/read head module assembly 308 to each of the flexure brackets 300A-D via the bonding surfaces 302. The flexure brackets 300A-D, although not shown, may additionally be bonded to a VCM moveable beam. One having ordinary skill in the art of tape storage would recognize from this disclosure that a VCM is a needed part and not needed to be fully detailed for understanding. Further, one having ordinary skill in the art would recognize that the addition of the disclosed flexure brackets 300A-D to the write/read head module assembly 308 would substantially increase the precision of the write/read head module assembly 308 to position itself during data storage interactions (e.g., reading/writing).

Figure 4:
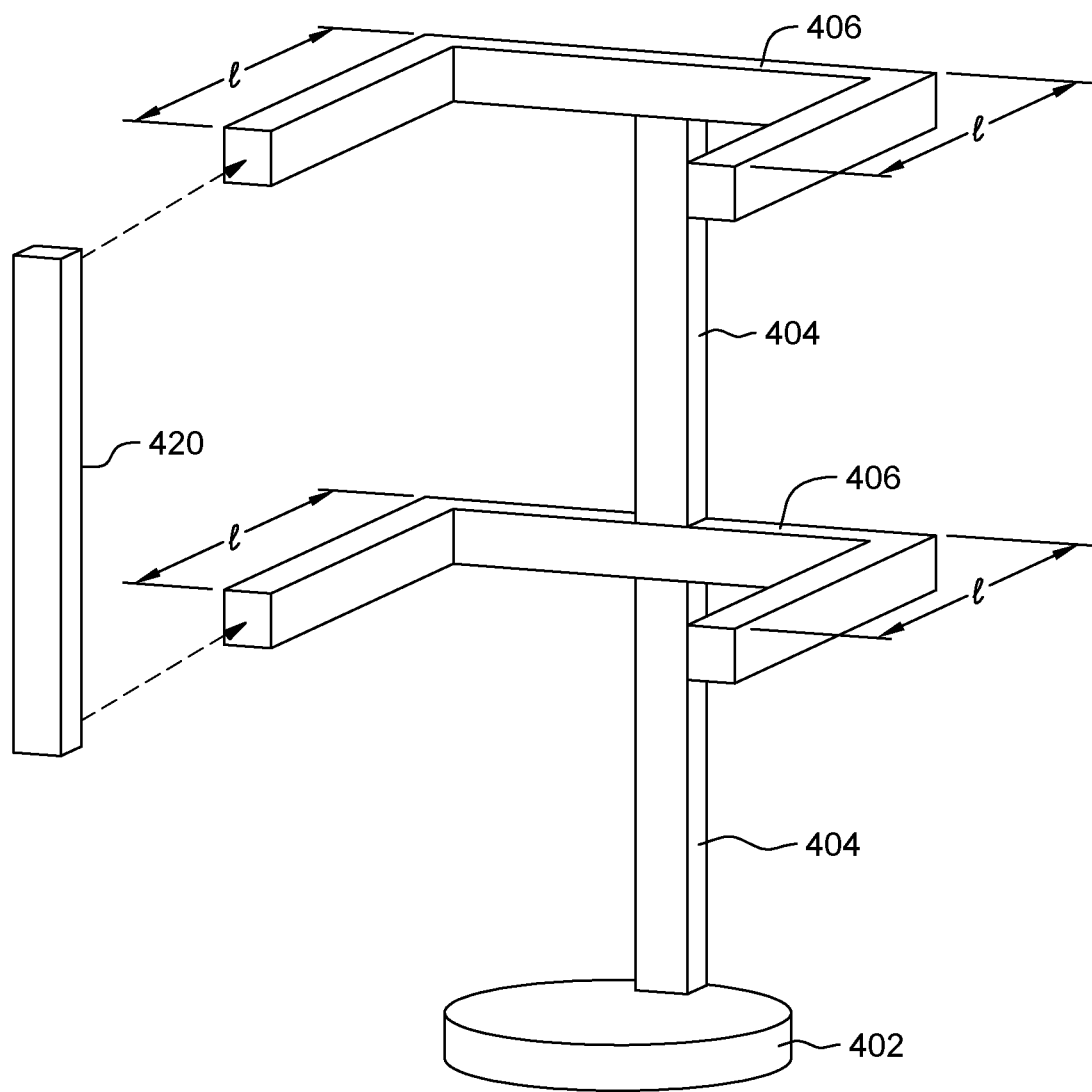
FIG. 4 depicts a top-down, front view of a traditional write/read tape head being mounted to moveable beams that are connected to a center beam that is mounted to a traditional fine motion voice coil motor assembly, in accordance with embodiments of the present disclosure.

Turning now to FIG. 4, depicted is a top-down, front view of a traditional write/read tape head 420 being mounted (e.g., bonded, connected, etc.) to moveable beams 406, which have a same length, and which are connected to a center beam 404 that is mounted to a traditional fine motion voice coil motor assembly 402, in accordance with embodiments of the present disclosure. It is noted that one having ordinary skill in the art would recognize that the voice coil motor assembly 402 would incorporate head cables, but for ease of viewing they are left out of FIG. 4 (and the subsequent FIGS. 5-7).

FIG. 4 is included to indicate that traditionally, the moveable beams 406 of the voice coil motor assembly 402 would normally have been bonded directly to the traditional write/read tape head 420. The traditional bonding of the traditional write/read head 420 to the moveable beams 406 only allows for select fine-motion movements. Whereas to be discussed below in regard to FIGS. 5-7, the present disclosure describes a method for a system that can amplify (e.g., increase) the fine-motion movements if needed to improve performance of a write/read tape head.

Figure 5:
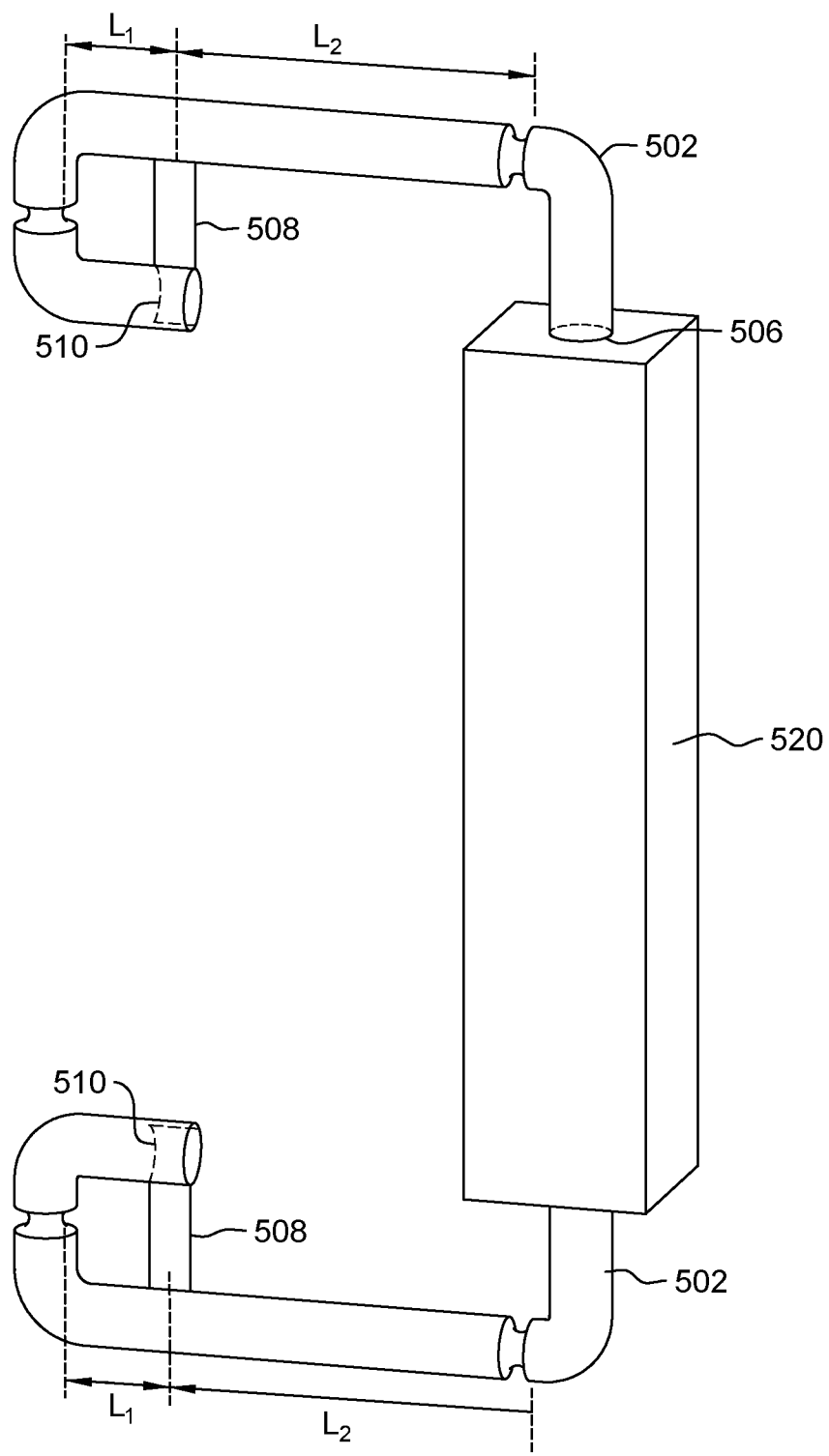
FIG. 5 depicts a top-down, front view of semi-flexible structures with piezoelectric stacks bonded to either end of a write/read tape head, in accordance with embodiments of the present disclosure.

Referring now to FIG. 5, depicted is a top-down, front view of semi-flexible structures 502, with piezoelectric stacks 508, that are bonded to either end of a write/read tape head 520, in accordance with embodiments of the present disclosure. In some embodiments, the semi-flexible structures 502 (e.g., a first semi-flexible structure and a second semi-flexible structure) are generated. In some embodiments, the semi-flexible structures 502 are generate by bending, notching, etc. a malleable metal, such as, stainless steel.

In some embodiments, one of the semi-flexible structures 502 is then bonded at the bond point 506 to a first end of the write/read tape head 520. The other semi-flexible structure 502 is then bonded to a second (e.g., opposite) end of the write/read tape head 520 (a bond point is not shown for the other semi-flexible structure).

In some embodiments, both the semi-flexible structures 502 are J-shaped. The J-shape is a curved shape with two opposite sides. A first side of the J-shape has a lower height than a second side of the J-shape. As depicted the first side of the J-shape of the semi-flexible structures 502 include beam bonding surfaces 510, which will bond to the moveable beams 606 of FIG. 6 that is discussed below in more detail.

In some embodiments, both of the semi-flexible structures 502 have multiple concavities that increase flexibility of the semi-flexible structures 502 and increase amplification of micro-actuator motion. In some embodiments, the amplification of micro-actuation is achieved by the ratio of L2/L1.

In some embodiments, the second side (e.g., the longer side of the J-shape) of one of the (e.g., first) semi-flexible structures 502 is bonded (e.g., as depicted by the bond point 506) to the first end of the write/read tape head 520. The second side of the other (e.g., second) semi-flexible structure 502 is bonded to the second end of the write/read tape head 520.

In some embodiments, both semi-flexible structures 502 include bonded piezoelectric stacks 508. The bonded piezoelectric stacks 508 are located between the first side of the J-shape and the second side of the J-shape of the semi-flexible structures 502, respectively.

The bonded piezoelectric stacks 508 are respectively positioned to have a top portion flush with an end portion of the first side (e.g., the side with lower height and the beam bonding surfaces 510) of the J-shape of each of the semi-flexible structures 502. The bonded piezoelectric stacks 508 extend directly across from the first side of the J-shape to a corresponding internal portion of the second side of the J-shape of each of the semi-flexible structures 502.

Figure 6:
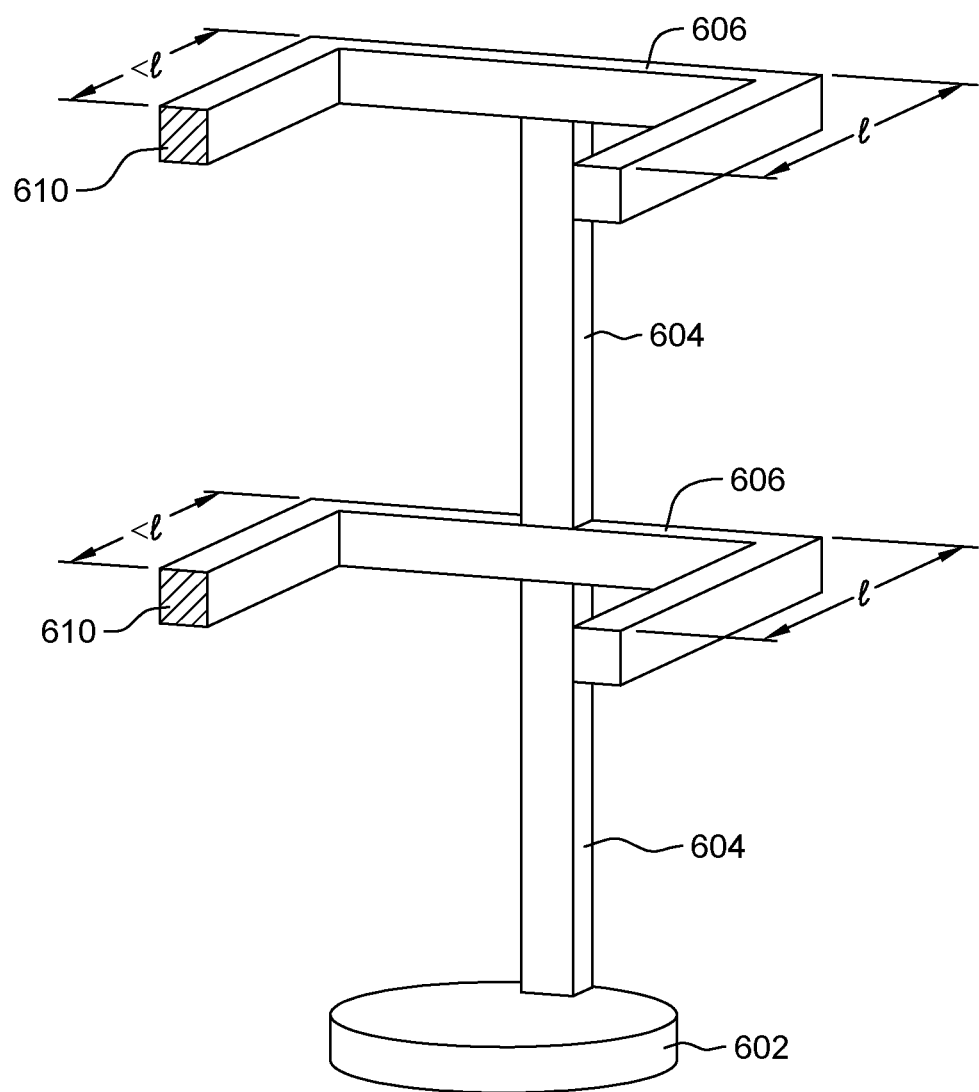
FIG. 6 depicts a top-down, front view of moveable beams that are augmented for bonding to semi-flexible structures and that are connected to a center beam that is mounted to a fine motion voice coil motor assembly, in accordance with embodiments of the present disclosure.

Referring now to FIG. 6, depicted is a top-down, front view of moveable beams 606 that are augmented for bonding, as depicted by semi-flexible structure bond points 610, to semi-flexible structures (not shown, but is discussed more fully in regard to FIG. 7 below) and that are connected to a center beam 604 that is mounted to a fine motion voice coil motor assembly 602, in accordance with embodiments of the present disclosure. In some embodiments, the components of FIG. 6 are the same, or substantially similar, to the components found within FIG. 4.

In some embodiments, the moveable beams 606 are the moveable beams 406 from FIG. 4, but the moveable beams 406 have been augmented to include the semi-flexible structure bond points 610. In some embodiments, a first side of the moveable beams 606 with the semi-flexible structure bond points 610 have a length that is less than the length of a second side of the moveable beams 606. This first side of the moveable beams 606 may be shorter than the second side of the moveable beams 606 in order to account for the bonding of the semi-flexible structure that will be attached. In some embodiments, the first side of the J-shape of the semi-flexible structure with the beam bonding surface may be the length of what would be remaining of the second side of the moveable beams 606, e.g., the first side of the J-shape bonded to the first side of the moveable beams 606 would equal the full length of the second side of the moveable beams 606. In some embodiments, both sides of the moveable beams 606 may have the same length regardless of the semi-flexible structure bond points 610.

Figure 7:
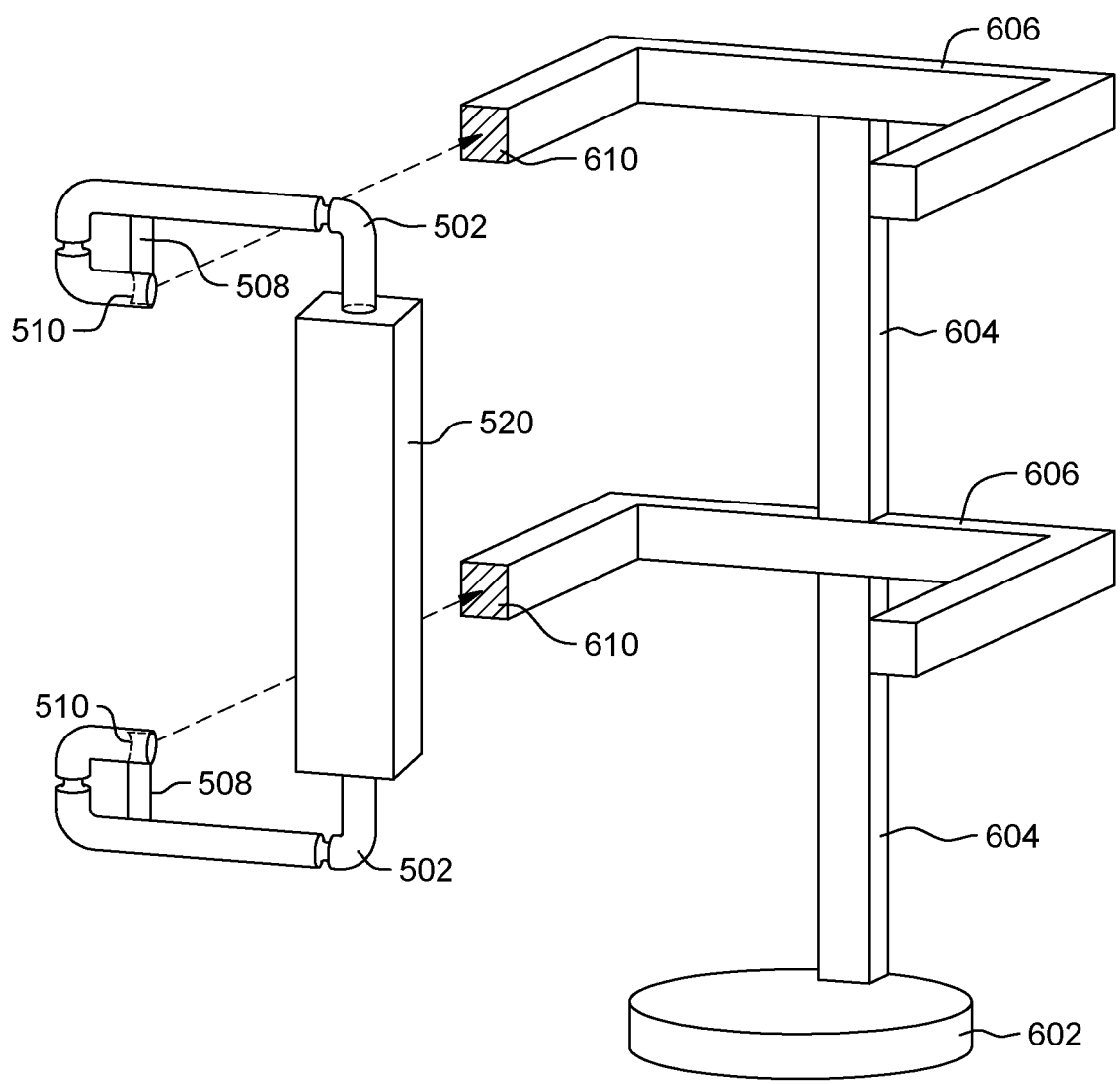
FIG. 7 depicts a top-down, front view of semi-flexible structures bonding to moveable beams, in accordance with embodiments of the present disclosure.

Referring now to FIG. 7, depicted is a top-down, front view of semi-flexible structures 502 bonding to moveable beams 606 via beam bonding surfaces 510 to semi-flexible structure bonding points 610, in accordance with embodiments of the present disclosure. It is noted that FIG. 7 illustrates the components found in FIGS. 5 and 6.

In some embodiments, the beam bonding surfaces 510 are bonded to the semi-flexible structure bonding points 610, thus connecting the apparatuses found in FIGS. 5 and 6. The resulting structure is the write/read tape head 520 being functionally attached to the fine motion voice coil motor assembly 602, which now can have amplified fine motion due to the semi-flexible structures 502.

It is noted that compared to traditional methods where the moveable beams 606 of the fine motion voice coil motor assembly 602 would have been bonded directly to the write/read tape head 520, that the moveable beam 606 are bonded to the semi-flexible structures 502. The write/read head 520 is then bonded via bond point 506 and supported by the semi-flexible structures 502.

The semi-flexible structures 502 move, in unison, driven by the fine motion voice coil motor assembly 602. Within each semi-flexible structure 502, as discussed previously, the piezoelectric stacks 508, or another micro-actuator, is positioned. It is noted that the present disclosure is not to be limited to the piezoelectric stacks 508 as other compact micro-actuator systems could be used. Micro-actuation is accomplished by the expansion and/or contraction motion of both piezoelectric stacks 508 acting in unison. When activated both expand and/or contract to amplify the motion of the write/read head 520. In some embodiments, the exact polarity will be determined by the specific orientation of the brackets as they could be oriented in the same fashion or opposing fashion, as shown with by the shorter end of the J-shape of the semi-flexible structures 502 facing inward. In such a case, opposing polarity would be needed to motion the write/read head 520 in a same direction.

In some embodiments, since the write/read head 520 is floating, or has clearance all around all other surfaces of the center beam 604 and the moveable beams 606, the write/read head 520 moves in a relative fine track following motion with respect to the center beam 604, the moveable beams 606, and the fine motion voice coil motor assembly 602.

It is further noted that the bonding in the present disclosure is between the beam bonding surfaces 510 and the semi-flexible structure bond points 610, and that there is no other bond between the moveable beams 606 and the write/read head 520 (which allows for the "floating" nature and available clearance of the write/read head 520).

In some embodiments, the fine motion voice coil motor assembly 602 is activated. The activation of the fine motion voice coil motor assembly 602 may cause the semi-flexible structures 502 to move, in unison, in a same direction (e.g., up, down, in-plane, out-of-plane, etc.).

In some embodiments, the semi-flexible structures 502 may move in unison due to their connection to the moveable beams 606, which begin to move due to activation of the fine motion voice coil motor assembly 602.

In some embodiments, the semi-flexible structures 502 may move in unison due to the activating of the piezoelectric stacks 508, as the piezoelectric stacks 508 react to the activation of the fine motion voice coil motor assembly 602 that causes the semi-flexible structures 502 to apply a stress to the piezoelectric stacks 508 that in turn makes the piezoelectric stacks 508 to either expand or contract. In some embodiments, the piezoelectric stacks 508 activate to amplify the motion of the write/read head 520.

Figure 8:
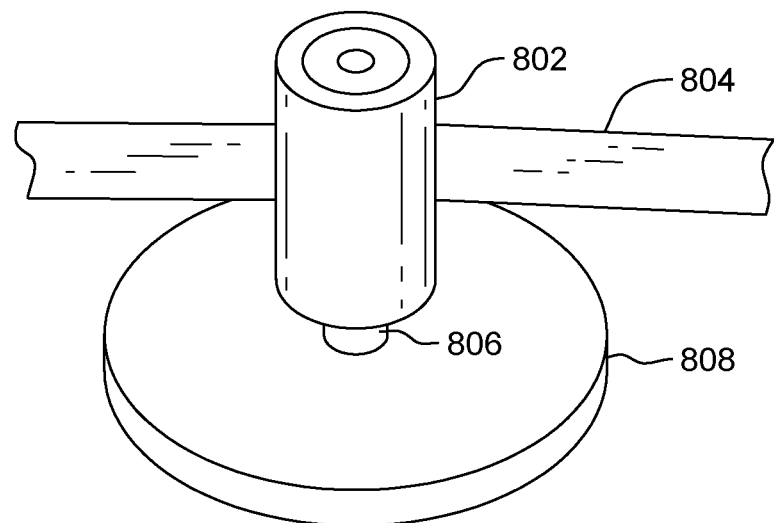
FIG. 8 depicts a top-down, front view of a tape guide roller bearing affixed to a rigid support base, in accordance with embodiments of the present disclosure.

Turning now to FIG. 8, depicted is a top-down, front view of a tape guide roller bearing 802 affixed to a rigid support base 808, in accordance with embodiments of the present disclosure. In some embodiments, the rigid support base 808 includes a rigid support shaft 806 that is in the center of the rigid support base 808. In some embodiments, the tape guide roller bearing 802 is affixed to the rigid support base 808 via the rigid support shaft 806. The tape guide roller bearing 802 may be positioned around the rigid support shaft 806 and rotate in either a clockwise or counter-clockwise direction around/on the rigid support shaft 806. The rotation of the tape guide roller bearing 802 may move a tape 804 in whichever direction the tape guide roller bearing 802 is rotating.

In some embodiments, the tape guide roller bearing 802 may have a tape skew (e.g., tilt) that pushes the tape guide roller bearing 802 in either a left, or right direction, that is off-center from where the tape guide roller bearing 802 should be positioned. In some embodiments, the tape guide roller bearing 802 may have a tilt pitch that pushes the tape guide roller bearing 802 either into, or away from, the tape 804.

Figure 9:
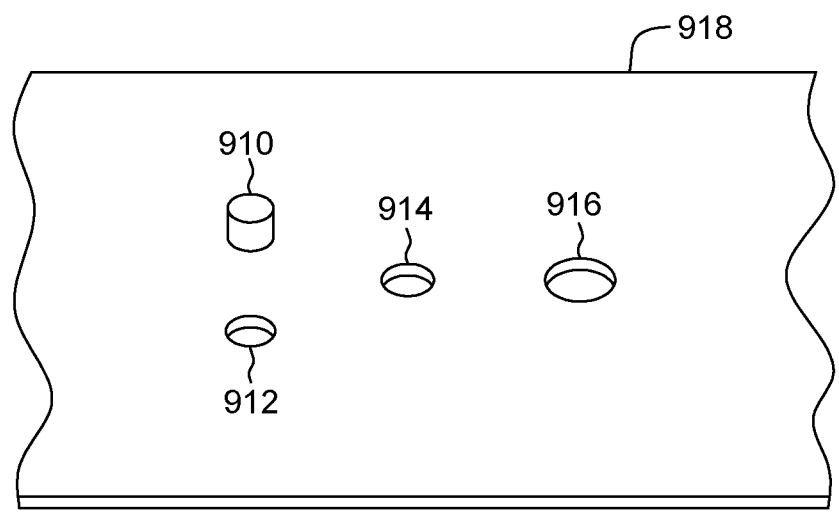
FIG. 9 depicts a top-down, front view of a tape deck base, in accordance with embodiments of the present disclosure.

Referring now to FIG. 9, depicted is a top-down, front view of a tape deck base 918, in accordance with embodiments of the present disclosure. In some embodiments, the tape deck base 918 includes three openings 912, 914, and 916. The first opening 912 is for a first jack screw (e.g., jack set screw 1206) to be placed through that will secure the rigid support base 808 of FIG. 8, and which will be discussed more fully in regard to FIG. 12.

The second opening 914 is for a center screw (1204, which is discussed in fuller detail below in regard to FIG. 12) that attaches to the rigid support shaft 806 or the rigid support base 808, or both of FIG. 8, and again, which will be discussed more fully in regard to FIG. 12. The third opening 916 is for a second jack screw to be placed through that additionally secures the rigid support based 808 to the tape deck base 918, however, as will be discussed more fully in regard to FIG. 12, the third opening 916 may have the second jack screw removed and replaced with a piezoelectric stack (e.g., 1022 of FIG. 10).

In some embodiments, the tape deck base 918 includes a tape deck post 910 that juts upward from the tape deck base 918 and that will insert into an adjoining concave opening (not shown) in the rigid support base 808. The tape deck post 910 provides added tilt pitch and skew protections by being a permanently affixed structure that can help withstand the motions of the tape guide roller bearing 802 during tape operations.

Figure 10:
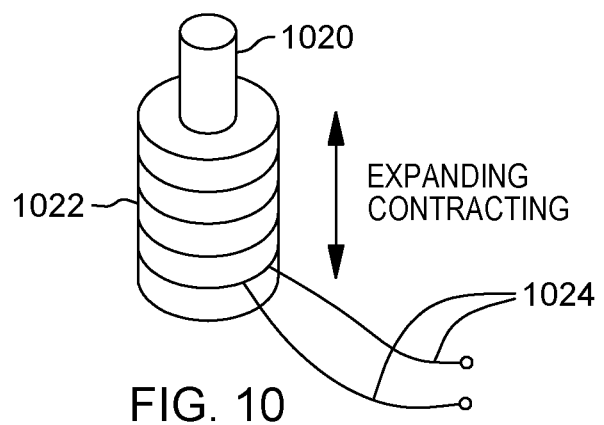
FIG. 10 depicts a top-down, front view of a piezoelectric stack, in accordance with embodiments of the present disclosure.

Referring now to FIG. 10, depicted is a top-down, front view of a piezoelectric stack 1022, in accordance with embodiments of the present disclosure. In some embodiments, the piezoelectric stack 1022 includes a support rod 1020 that is attached to a top/upper portion of the piezoelectric stack 1022. In some embodiments, the piezoelectric stack 1022 includes wires 1024 which can direct an electric charge to the piezoelectric stack 1022, which will in turn cause the piezoelectric stack 1022 to either expand or contract (e.g., with the addition or removal of the charge).

Figure 11:
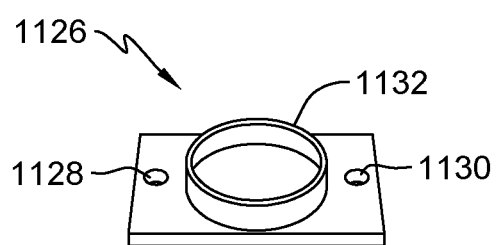
FIG. 11 depicts a top-down, front view of a lower end support bracket, in accordance with embodiments of the present disclosure.

Referring now to FIG. 11, depicted is a top-down, front view of a lower end support bracket 1126, in accordance with embodiments of the present disclosure. In some embodiments, the lower end support bracket 1126 includes two connecting screw openings 1128 and 1130 and a piezoelectric stack lip 1132. The piezoelectric stack lip 1132, as discussed more below in regard to FIG. 12, may be used to cup around a bottom portion of the piezoelectric stack 1022 of FIG. 10 and help secure and stabilize the piezoelectric stack 1022.

Figure 12:
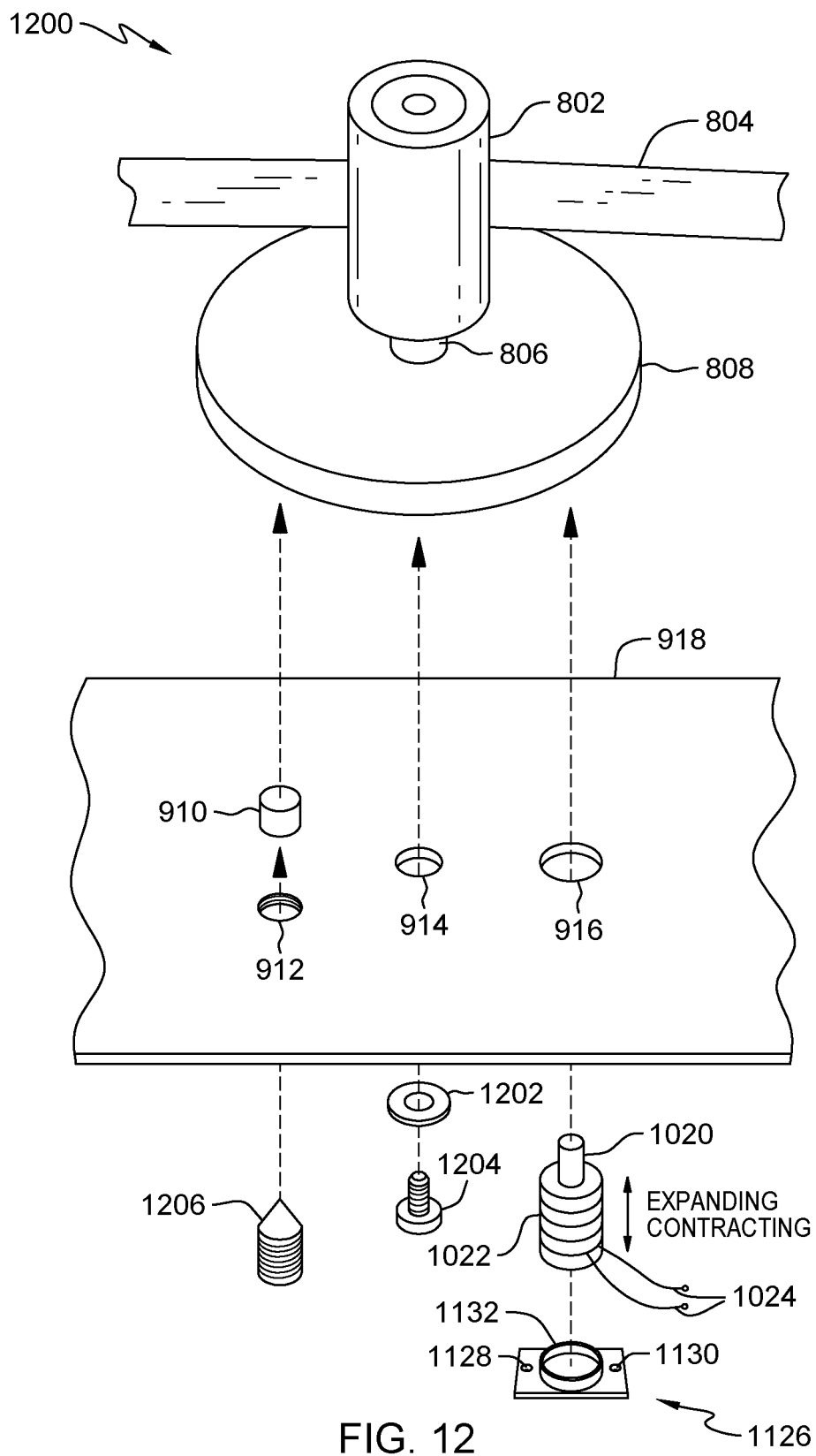
FIG. 12 depicts a top-down, front view of an assembly of a dynamic tape guide bearing tilt mechanism, in accordance with embodiments of the present disclosure.

Referring now to FIG. 12, depicted is a top-down, front view of an assembly of a dynamic tape guide bearing tilt mechanism 1200, in accordance with embodiments of the present disclosure. In some embodiments, the assembly of the dynamic tape guide bearing tilt mechanism 1200 includes the use of each, or a substantial portion, of the components described in regard to FIGS. 8-11. In some embodiments, the assembly of the dynamic tape guide bearing tilt mechanism 1200 further includes the addition of a jack set screw 1206, a center screw 1208, and a Belleville spring washer 1202.

In some embodiments, the assembly of the dynamic tape guide bearing tilt mechanism 1200 begins with a bottom portion of the rigid support base 808 attached to a top portion of the tape deck base 918 via the tape deck post 910 being inserted into a corresponding adjoining concave opening (not shown) in the rigid support base 808, the jack set screw 1206 inserted through the first opening 912, the center screw 1204 inserted through both an opening in the Belleville spring washer 1202 and the second opening 914, and a second jack screw (not shown) inserted through the third opening 916. It is noted that each screw (1206, 1204, and the second jack screw) has a corresponding opening in the bottom portion of the rigid support base 808 to which they secure into. It is further noted that the Belleville spring washer 1202 is not inside the tape deck base 918 but is below the tape deck base 918 and is shown for ease of understanding.

The assembly of the dynamic tape guide bearing tilt mechanism 1200 may then proceed by removing the second jack screw from securing the tape deck base 918 to the rigid support base 808 via the third opening 916. In some embodiments, to replace the second jack screw, the piezoelectric stack 1022 is inserted through the third opening 916 and the support rod 1020 now protrudes into the corresponding opening in the bottom portion of the rigid support base 808.

In some embodiments, because the piezoelectric stack 1022 is not a screw, it should be secured to the tape deck base 918 via the lower end support bracket 1126. The piezoelectric stack lip 1132 cups around a bottom portion of the piezoelectric stack 1022 and helps secure and stabilize the piezoelectric stack 1022. The lower end support bracket 1126 is then secured to the tape deck base 918 via two screws (not shown) inserted through the two connecting screw openings 1128 and 1130. In some embodiments, two corresponding openings are made (e.g., drilled) for the two connecting screws to be inserted.

In some embodiments, once the piezoelectric stack 1022 is secured in place, the piezoelectric stack 1022 can tilt the tape guide roller bearing 802, in a skew direction to improve the motion of the tape 804 in a tape path. The piezoelectric stack 1022 tilts the tape guide roller bearing 802 by either expanding or contacting, which pushes or pulls the support rod 1020 into or away from the rigid support base 808, which in turn would tilt the tape guide roller bearing 802 as it is affixed to the rigid support shaft 806.

In some embodiments, the tilt of the tape guide roller bearing 802 is askew from the center of the rigid support base 808. That is, because the piezoelectric stack 1022 is positioned through the third opening 916, which is depicted to the right of the center of the assembly of the dynamic tape guide bearing tilt mechanism 1200, the tape guide roller bearing 802 tilts to the left when the piezoelectric stack 1022 expands and will not tilt to the right (e.g., the physical presence of the rigid support base 808 prevents the tape guide roller bearing 802 from tilting past it).

It is noted that the tape deck post 910 and the jack set screw 1206, along with the support rod 1020 of the piezoelectric stack 1022 create a 3-point contact system for the dynamic tape guide bearing tilt mechanism 1200, such that when the piezoelectric stack 1022 is raised or lowered, the rigid support base 808 will tilt in the skew direction while remaining in contact with the other two contact points (e.g., the tape deck post 910 and the jack set screw 1206). This can be done because the center screw 1204 and the Belleville spring washer 1202 act as a constant downward force to ensure the rigid support base 808 remains in contact with the three "posts" at all times, e.g., the tape deck post 910, the jack set screw 1206, and the support rod 1020. Further, the Belleville spring washer 1202 allows for small amounts of tilt to occur when the piezoelectric stack 1022 is expanded or contracted.

It is further noted that the embodiments discussed in this disclosure and in regard to the FIGS. 1-12 can be contemplated to be used either individually or in any combination that could therein with be envisioned.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A method for implementing a non-interfering micro-positioning device for a tape drive write/read head module assembly utilizing piezoelectric elements, the method comprising:
   generating at least two flexure brackets, wherein each flexure bracket includes at least one piezoelectric element attached thereto;
   affixing at least one of the flexure brackets to a first side of the write/read head module assembly; and
   affixing at least another one of the flexure brackets to a second side of the write/read head module assembly;
   wherein after the affixing of the flexure brackets to the write/read head module assembly, each piezoelectric element has a longitudinal orientation that generally corresponds to a longitudinal orientation of the write/read head module assembly.

2. The method of claim 1, wherein the at least two flexures include a flexure for each of a top portion and a bottom portion of the first side of the write/read head module assembly and the second side of the write/read head module assembly.

3. The method of claim 1, wherein the write/read head module assembly includes one or more head cables and a mechanical ground module for the at least two flexures to shift on.

4. The method of claim 1, further comprising:
   energizing the at least two flexure brackets in order to shift the write/read head module assembly in a particular direction.

5. The method of claim 4, wherein shifting the write/read head module assembly in the particular direction is done in a corresponding direction as a placement of the mechanical ground.

6. The method of claim 4, wherein energizing the at least two flexure brackets in order to shift the write/read head module assembly in the particular direction includes energizing the piezoelectric elements of the at least two flexure brackets in concert.

7. The method of claim 6, wherein energizing the at least two flexure brackets in concert causes the expansion of the at least two flexure brackets.

8. The method of claim 6, wherein energizing the at least two flexure brackets concert causes the contraction of the at least two flexure brackets.

9. A non-interfering micro-positioning system for a tape drive write/read head module assembly utilizing piezoelectric elements, the system comprising:
   at least two flexure brackets, wherein each flexure bracket includes at least one piezoelectric element attached thereto;
   at least one of the flexure brackets affixed to a first side of the read/write head module assembly; and
   at least another one of the flexure brackets affixed to a second side of the write/read head module assembly;
   wherein each piezoelectric element has a longitudinal orientation that generally corresponds to a longitudinal orientation of the write/read head module assembly.

10. The system of claim 9, wherein the at least two flexures include a flexure for each of a top portion and a bottom portion of the first side of the write/read head module assembly and the second side of the write/read head module assembly.

11. The system of claim 9, wherein the write/read head module assembly includes one or more head cables and a mechanical ground module for the at least two flexures to shift on.

12. The system of claim 9, wherein the at least two flexure brackets are energized in order to shift the write/read head module assembly in a particular direction.

13. The system of claim 12, wherein shifting the write/read head module assembly in the particular direction is done in a corresponding direction as a placement of the mechanical ground.

14. The system of claim 12, wherein energizing the at least two flexure brackets in order to shift the write/read head module assembly in the particular direction includes energizing the piezoelectric elements of the at least two flexure brackets in concert.

15. The system of claim 14, wherein energizing the at least two flexure brackets in concert causes the expansion of the at least two flexure brackets.

16. The system of claim 14, wherein energizing the at least two flexure brackets in concert causes the contraction of the at least two flexure brackets.

* * * * *